US010547295B2

(12) United States Patent
Taft et al.

(10) Patent No.: US 10,547,295 B2
(45) Date of Patent: Jan. 28, 2020

(54) DELAY LINE WITH SELECTABLE DELAY

(71) Applicant: Texas Instruments Incorporated, Dallas, TX (US)

(72) Inventors: Robert Callaghan Taft, Munich (DE); Vineethraj Rajappan Nair, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/974,956

(22) Filed: May 9, 2018

(65) Prior Publication Data

US 2018/0337665 A1 Nov. 22, 2018

Related U.S. Application Data

(60) Provisional application No. 62/507,721, filed on May 17, 2017.

(51) Int. Cl.
*H03K 5/14* (2014.01)
*H03K 5/00* (2006.01)

(52) U.S. Cl.
CPC ..... *H03K 5/14* (2013.01); *H03K 2005/00019* (2013.01)

(58) Field of Classification Search
CPC ............ H03K 5/14; H03K 5/145; H03K 5/13; H03K 5/131
See application file for complete search history.

(56) References Cited

U.S. PATENT DOCUMENTS

| | | | | |
|---|---|---|---|---|
| 4,820,944 A * | 4/1989 | Herlein | ............ | G01R 31/31713 327/270 |
| 5,424,696 A * | 6/1995 | Nakahara | ................ | H01P 1/185 333/156 |
| 5,680,079 A * | 10/1997 | Inami | ...................... | H01P 1/185 333/161 |
| 5,896,055 A * | 4/1999 | Toyonaga | ................. | G06F 1/10 326/93 |
| 6,348,826 B1 * | 2/2002 | Mooney | ............ | G01R 31/3016 327/231 |
| 6,525,588 B2 * | 2/2003 | Saeki | ........................ | G06F 1/10 327/292 |
| 6,741,122 B2 * | 5/2004 | Kapoor | ..................... | G06F 1/10 327/283 |

(Continued)

*Primary Examiner* — Thomas J. Hiltunen
(74) *Attorney, Agent, or Firm* — John R. Pessetto; Charles A. Brill; Frank D. Cimino

(57) ABSTRACT

In described examples, an electronic circuit for delaying a signal (received at an input node) includes a delay line with multiple tap locations, a tap line proximate to the delay line and coupled to an output node, and multiple groups of switches. Switches in the groups of switches are severally coupled between tap locations corresponding to the respective group of switches, and the tap line. When the signal is propagated through the delay line, a first number of the switches corresponding to a selected tap location are closed, a second number of the switches corresponding to an adjacent tap location are closed, and the signal is transmitted with a delay through the closed switches, to the tap line, to the output node. The delay includes an average, weighted using the first and second numbers, of delays corresponding to the selected and adjacent tap locations.

16 Claims, 15 Drawing Sheets

(56) References Cited

U.S. PATENT DOCUMENTS

| | | |
|---|---|---|
| 7,064,599 B1 | 6/2006 | Taft |
| 7,570,133 B1 * | 8/2009 | Taft .................. H01P 1/184 |
| | | 333/156 |
| 8,259,884 B2 * | 9/2012 | Banu .................. G06F 1/12 |
| | | 375/356 |
| 10,031,353 B2 * | 7/2018 | Huang ................ G02F 1/0121 |
| 10,075,159 B1 * | 9/2018 | Birkbeck .............. H01P 1/10 |
| 10,277,215 B2 * | 4/2019 | Tsai .................. H03K 5/131 |

* cited by examiner

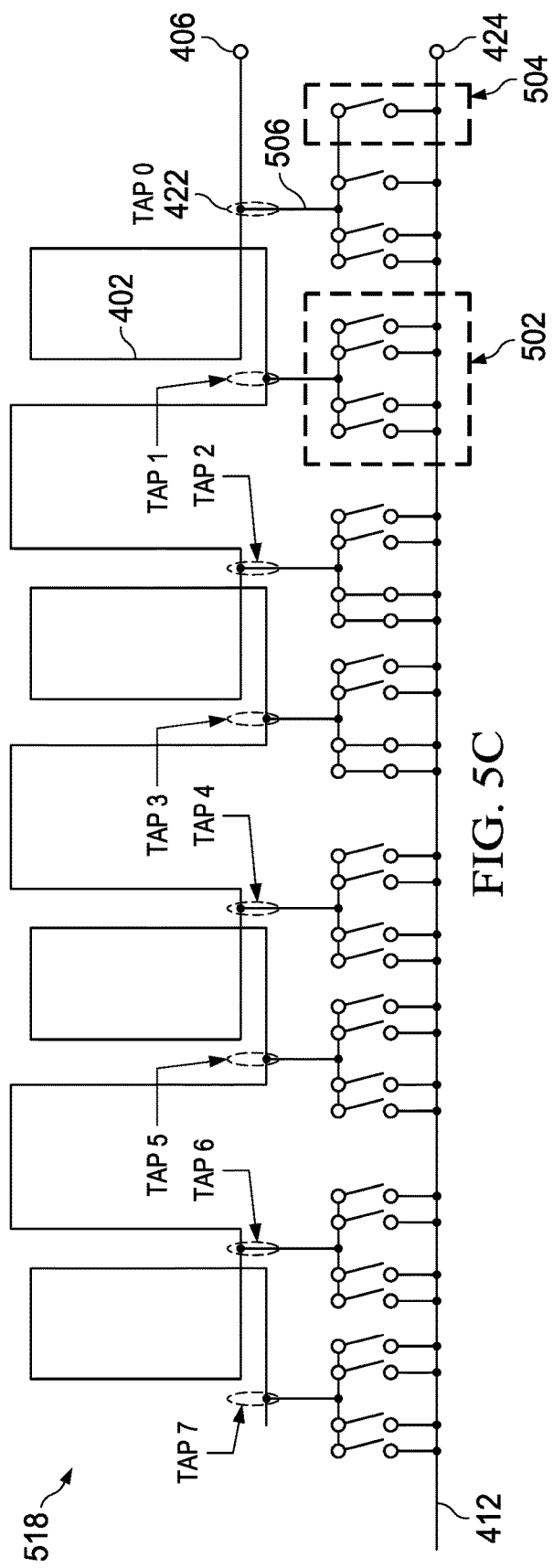
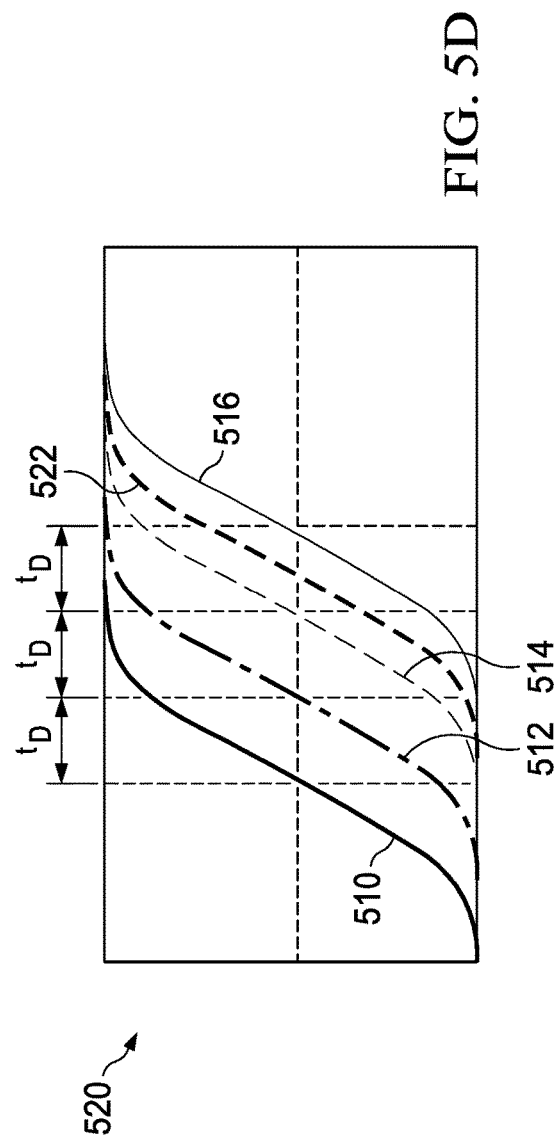
FIG. 5C
FIG. 5D

DELAY LINE WITH SELECTABLE DELAY

CROSS-REFERENCE TO RELATED APPLICATION

This application is a non-provisional of, and claims priority to, U.S. Provisional Patent Application Ser. No. 62/507,721, filed May 17, 2017, which is incorporated herein by reference.

BACKGROUND

The present application relates generally to electronic clock signals, and more particularly to electronic circuitry for delaying clock signals.

FIG. 1 schematically shows an example 100 of buffers 102 connected in series (only some of which are numbered to simplify the figure), with the throw of a switch 104 for selecting among the respective outputs 106 of the multiple buffers 102 and outputting that delay to its pole as shown as the Clock_Delayed signal. Each buffer 102 delays a signal, and selecting an output from among outputs 106 corresponds to selecting an amount of delay. This amount of delay roughly corresponds to the number of buffers 102 through which the signal has traveled when it has reached the output 106 selected by the switch 104. However, buffers 102 and other active delay elements consume power, and introduce noise and jitter into signals. Increasing the selected delay generally corresponds to using more buffers 102, and thus consuming more power and adding more noise to the signal. Further, in general, buffer 102 delay is significantly affected by (is a function of) variations in the process (P) used to fabricate the buffer 102, the supply voltage (V) used to power the circuit, and the operating temperature (T) of the circuit (collectively, PVT).

Some prior art embodiments use single-ended complementary metal oxide semiconductor (CMOS) or differential current-mode logic (CIVIL), and compensate for PVT variation by controlling delay variation of buffer elements.

SUMMARY

In described examples, an electronic circuit for delaying a signal includes a delay line with multiple tap locations, a tap line proximate to the delay line and coupled to an output node, and multiple groups of switches. The delay line is configured to receive the signal at an input node. Switches in respective ones of the groups of switches are severally coupled between ones of the tap locations corresponding to the respective group of switches, and the tap line. The switches are configured so that when the signal is propagated through the delay line, a first number of first ones of the switches corresponding to a selected tap location are closed, a second number of second ones of the switches corresponding to an adjacent tap location to the selected tap location are closed, and the signal is transmitted with a delay through the closed switches, to the tap line, to the output node. The switches are also configured so that the delay includes a weighted average of a first delay corresponding to the selected tap location and a second delay corresponding to the adjacent tap location, a weighting of the weighted average at least partially dependent on the first number and the second number. Delay is induced using physical propagation of the signal down a metal line (delay line). Induced delay is independent of transistor variations, applied voltage and operating temperature of the circuit. Accordingly, the circuit induces a delay in the signal which is independent of PVT variations, and the circuit can be configured to consume little or no power and to add little or no device noise to the applied input signal.

BRIEF DESCRIPTION OF THE DRAWINGS

FIG. 5C shows a plan and schematic view of a portion of the circuit shown in FIG. 4A in which multiple groups of switches, connected in parallel to the p line at tap locations, connect the p line to the p tap line.

FIG. 5D shows an example of a graph of voltage against time for outputs of the circuit portion (the view) of FIG. 5C.

DETAILED DESCRIPTION

As used herein, clock signal (or "clock") refers to a repetitive signal, usually of a fixed frequency, with period $T_{CLOCK}$. PVT-invariant refers to an electrical component or circuit which shows little or no dependence on process, supply voltage or temperature (PVT).

Figure 1:
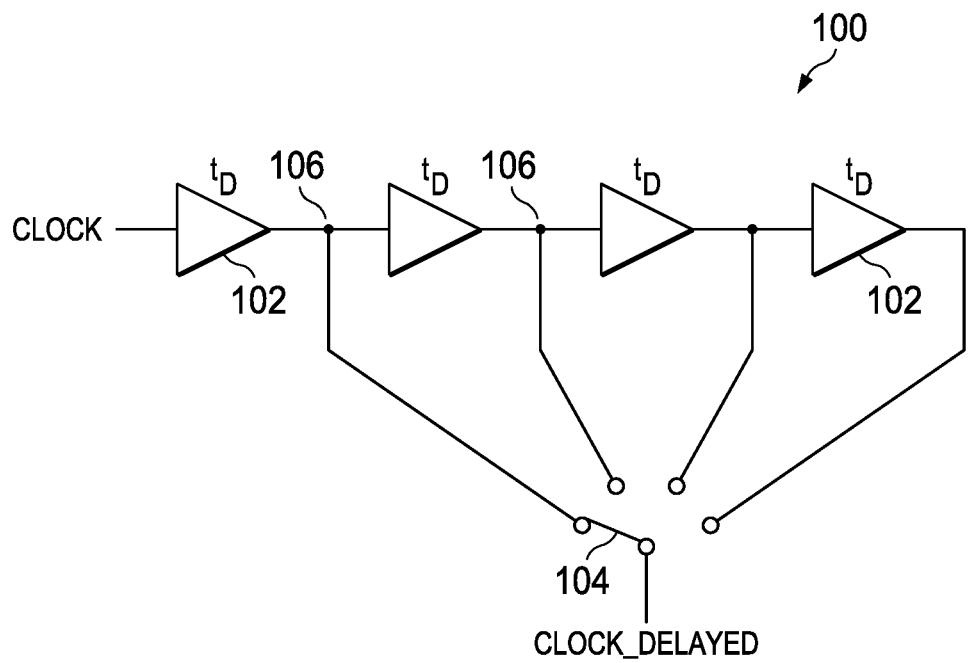
FIG. 1 schematically shows an example of buffers connected in series, with a switch for selection between the outputs of the various buffers.
Figure 2:
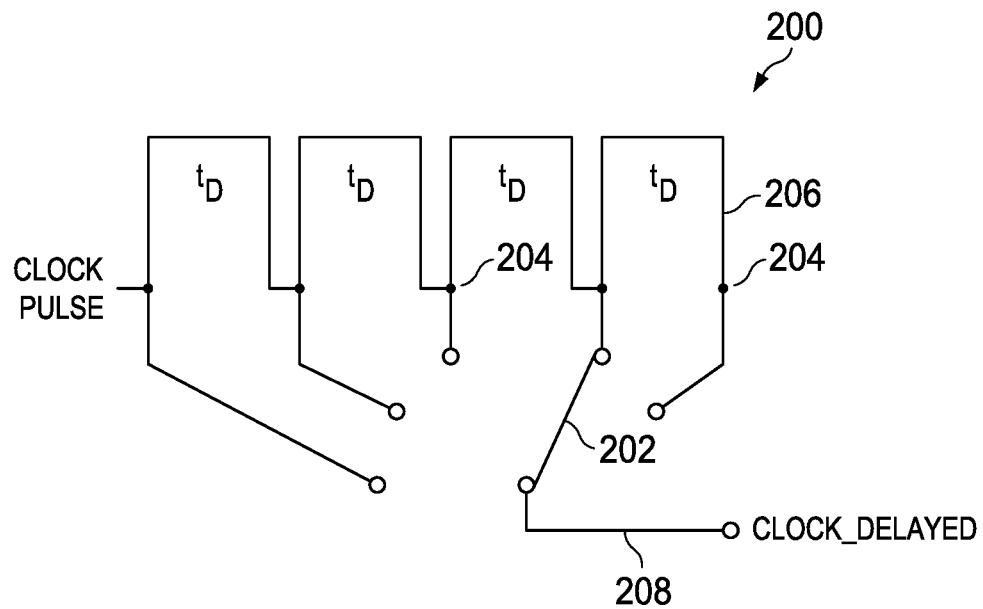
FIG. 2 shows a plan and schematic view of an example of a delay circuit conducting a clock signal, with a switch for selecting among specified tap locations on a delay line.

FIG. 2 shows a plan and schematic view of an example of a delay circuit 200 conducting a clock signal, with the throw of a switch 202 for selecting among specified tap locations 204 (only some of which are numbered to simplify the figure) on a delay line 206 and outputting that delay to its pole and an output line 208 as shown as the Clock_Delayed signal. The magnitude of the delay depends on properties (such as reactive impedance) of the delay line 206 up to the particular tap location 204 selected by the switch 202. Preferably, the delay line 206 comprises a metal line. Signal delay caused by propagation of the signal through the metal line is not an appreciable function of variation in the metal line or in transistors that may be connected to the metal line, and will generally be only weakly a function of the resistivity of the metal line. While delay is a strong function of the dielectric constant of the medium through which the signal propagates (generally, the dielectric material above and below the metal delay lines), the dielectric constant can be closely controlled during processing, so that it accordingly has an approximately fixed contribution to delay with negligibly small variations. Preferably, the delay line 206 is shaped in a space-filling pattern to efficiently use device area, and thereby reduce device area taken up by the delay line 206.

A delay line can be used advantageously to delay a high frequency clock. For example, a high frequency clock can be used in a high speed analog-to-digital converter (ADC) to control the sampling rate and timing of analog input to the ADC. Further, it is advantageous to adjust delay of a clock to interface an ADC to a high speed track and hold circuit. It is also advantageous to delay a clock when interleaving multiple ADCs to increase an effective sampling rate. Specifying clock delays applicable to the various interleaved ADCs facilitates accurate sampling timing of the interleaved ADCs to thereby mitigate timing-based interleaving spurs. It is further advantageous to use selected clock delay to phase-align multiple channels, each channel having its own ADC. The relative phase between ADCs can be set by adjusting the clock delays for respective ADCs.

Figure 3:
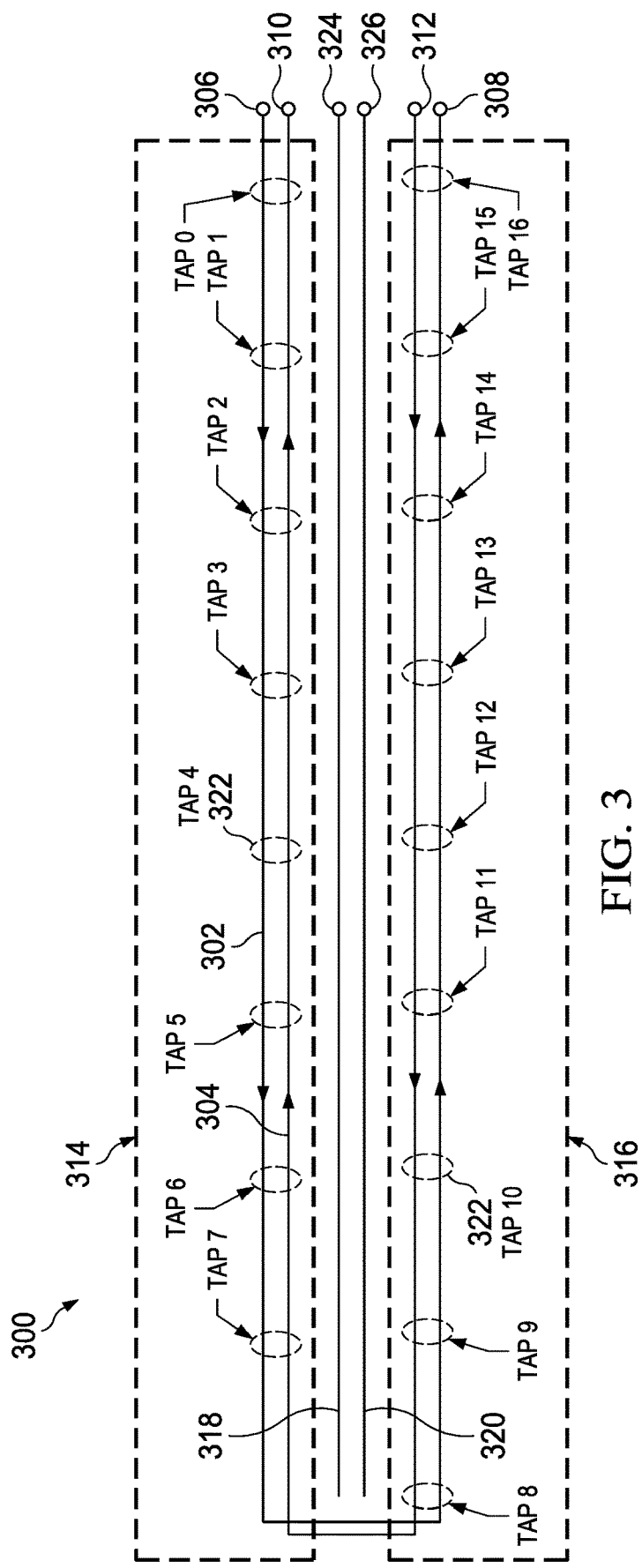
FIG. 3 shows a plan and schematic view of an example of a delay line.

FIG. 3 shows, by way of introduction to additional aspects detailed later, a plan and schematic view of an example of a delay line 300. The delay line 300 can be, for example, part of a semiconductor device on a die. The delay line 300 includes a p line 302 and an n line 304, preferably of equal length, to enable differential signal sampling. (The p line 302 and n line 304 nomenclature is used to indicate the opposite signs—positive and negative—of the signals which they are respectively configured to carry, as described below.) The p line 302 receives a clock (not shown) at a p line input node 306, and connects to an impedance matching the total impedance of the p line 302 (which terminates the p line 302) at a p line termination node 308. The n line 304 receives the same clock as the p line 302 (with the same amplitude as, but 180 degrees out of phase with respect to, the clock received by the p line 302) at an n line input node 310, and connects to an impedance matching the total impedance of the n line 304 (which terminates the n line 304) at an n line termination node 312. The p line 302 is proximate to (preferably, close enough to enable magnetic fields induced by the p line 302 and the n line 304 to reinforce each other, as discussed below) and parallel with the n line 304 for the majority (or all) of its length. Also, the p line input node 306 is proximate to the n line input node 310, and the p line termination node 308 is proximate to the n line termination node 312. However, the p line 302 is configured to carry current (represented by arrows) from the p line input node 306 to the p line termination node 308, and the n line 304 is configured to carry current from the n line termination node 312 to the n line input node 310 (because the p line 302 and the n line 304 receive clocks with equal amplitude but opposite phase).

The p line 302 and n line 304 run in a first direction, forming an upper portion 314 of the delay line 300, and then make a U-turn and run in a second, non-overlapping direction, forming a lower portion 316 of the delay line 300. The second direction is parallel and, with respect to current flow, opposite to the first direction. The overlapping (but not electrically intersecting) portions of the p line 302 and n line 304 enable the p line 302 to have approximately the same length as the n line 304 in both the upper portion 314 and the lower portion 316. This U-turn can be implemented (is used in some embodiments) to reduce the layout area devoted to the delay line. In some embodiments using predominantly straight delay lines (in contrast to, for example, the rectangular-looped/coiled delay lines shown in FIG. 4C) this U-turn is not used, because, for example, additional delay after the U-turn will generally be significantly reduced due to the shorter length of tap lines 318, 320 (described below) for an output signal to travel.

A p tap line 318 and a same-length n tap line 320 run in parallel between the upper portion 314 and the lower portion 316. Through switches, not shown but described below, the p tap line 318 can be selectively connected to the p line 302 and the n tap line 320 can be selectively connected to the n line 304 at multiple evenly-spaced switch-connected tap locations 322 (only some of which are labeled as 322, for simplicity, and as further described with respect to FIGS. 5A through 5D). Accordingly, discrete, selectable locations where the p tap line 318 is connectable to the p line 302 and locations where the n tap line 320 is connectable to the n line 304 are proximate to each other. Connections between lines 302, 304 and respective tap lines 318, 320 are direct, selectable conductive path electrical connections, enabling switchable selection from the lines 302, 304 onto the tap lines 318, 320 to output the clock with a corresponding selected delay. This is akin in certain respects to the connections between the switch 202 and a selected tap location 204 as shown in and described with respect to FIG. 2. Connections between lines 302, 304 and respective tap lines 318, 320 are not shown in FIG. 3 to simplify the drawing.

As shown in FIG. 3, preferably, the distance between each tap location 322 on lines 302, 304 and connecting points on respective tap lines 318, 320 is short (tap locations 322 on lines 302, 304 are proximate to respective tap lines 318, 320), to avoid disturbing clock signal propagation through the lines 302, 304.

The p tap line 318 is connected to a p output node 324 which outputs the inputted clock with an amount of delay dependent on which tap location 322 is selected. The amount of delay of the clock outputted by the p tap line 318 to the p output node 324 corresponds to the length of the p line 302 through which the clock propagates from the p line input node 306 to the selected tap location 322. The n tap line 320 is connected to an n output node 326 which outputs the inputted clock with an amount of delay dependent on which tap location 322 is selected. The amount of delay of the clock outputted by the n tap line 320 to the n output node 326 corresponds to the length of the n line 304 through which the clock propagates from the n line input node 310 to the selected tap location 322.

Tap locations 322 correspond to an amount of delay induced by the delay line 300 on the clock inputted into the p line 302 and the n line 304. The amount of induced delay is proportional to the inductance (reactive impedance) of the p line 302 and the n line 304 (respectively) per unit length, and to the length of the p line 302 and the n line 304 (respectively) through which the clock propagates from the respective input node 306, 310 to the selected tap location 322.

For a number M+1 tap locations 322, tap locations 322 are preferably numbered from tap 0, which is located proximate to the inputs 306, 310, to tap M, which is located proximate to the termination nodes 308, 312. Numbering of tap locations 322 is sequential along the length of the p line 302 and n line 304.

Figure 4A:
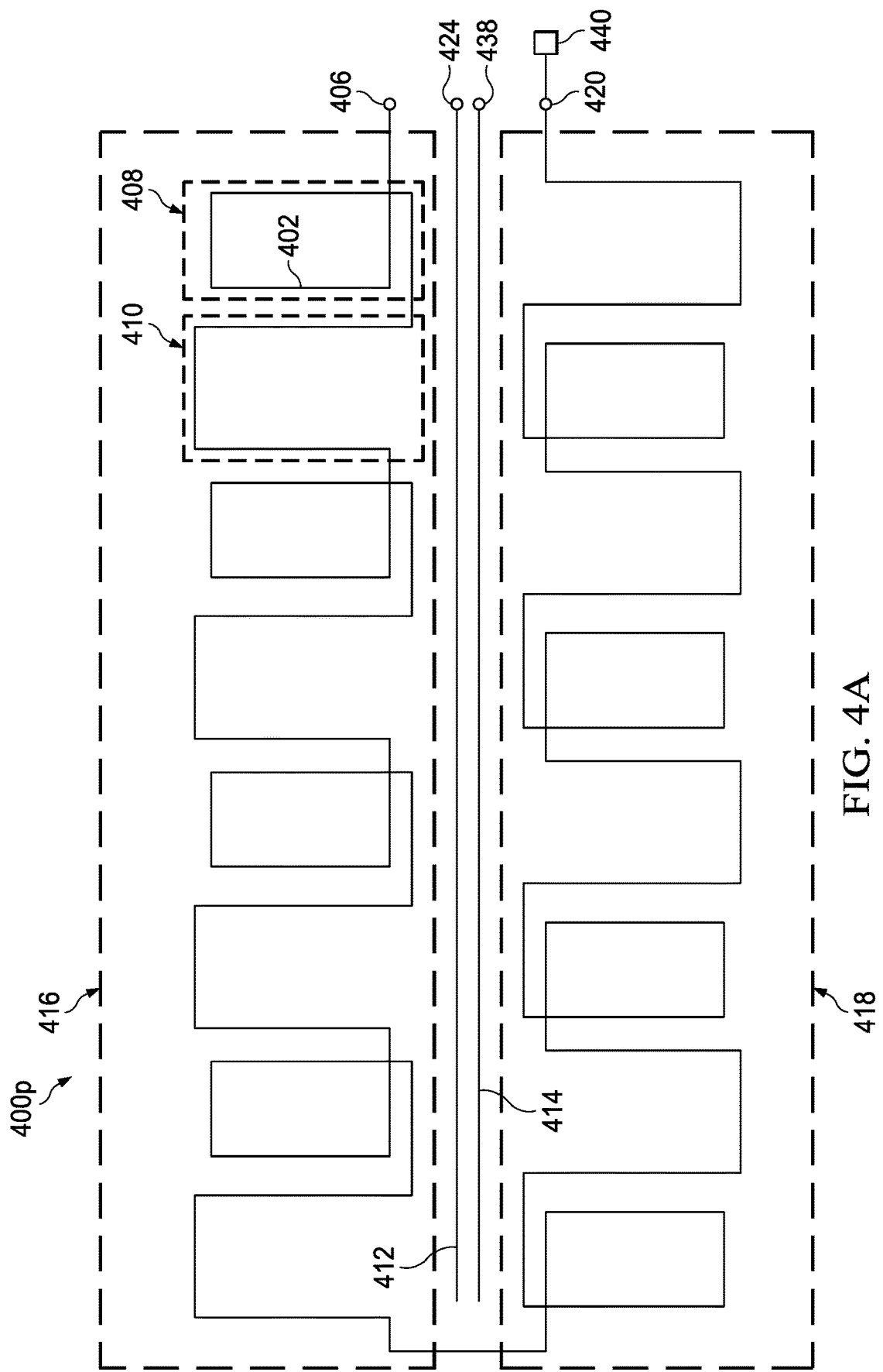
FIG. 4A shows a plan and schematic view of an example of a portion of a delay line as shown in FIG. 4C.
Figure 4B:
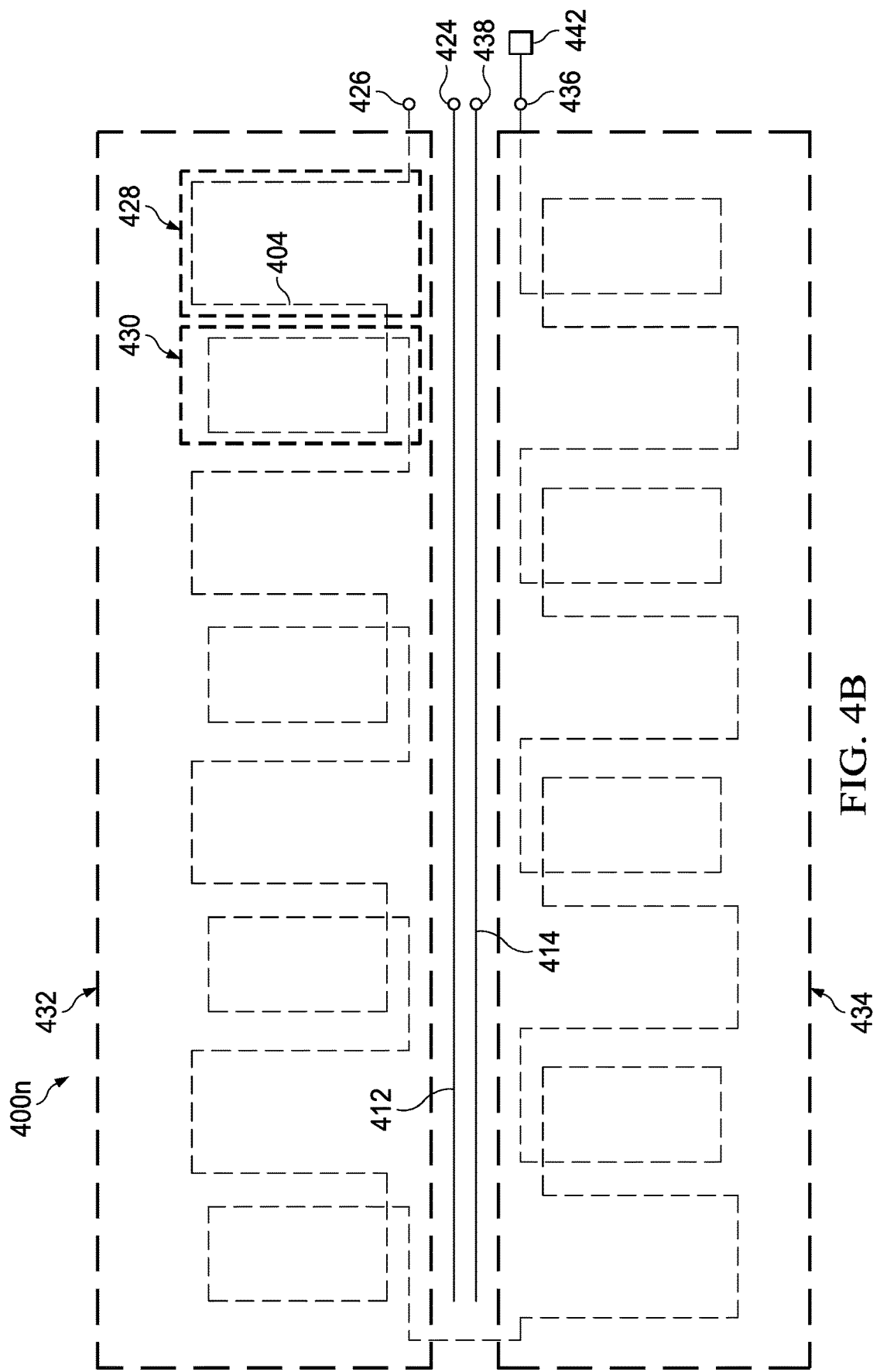
FIG. 4B shows a plan and schematic view of an example of a portion of a delay line as shown in FIG. 4C.
Figure 4C:
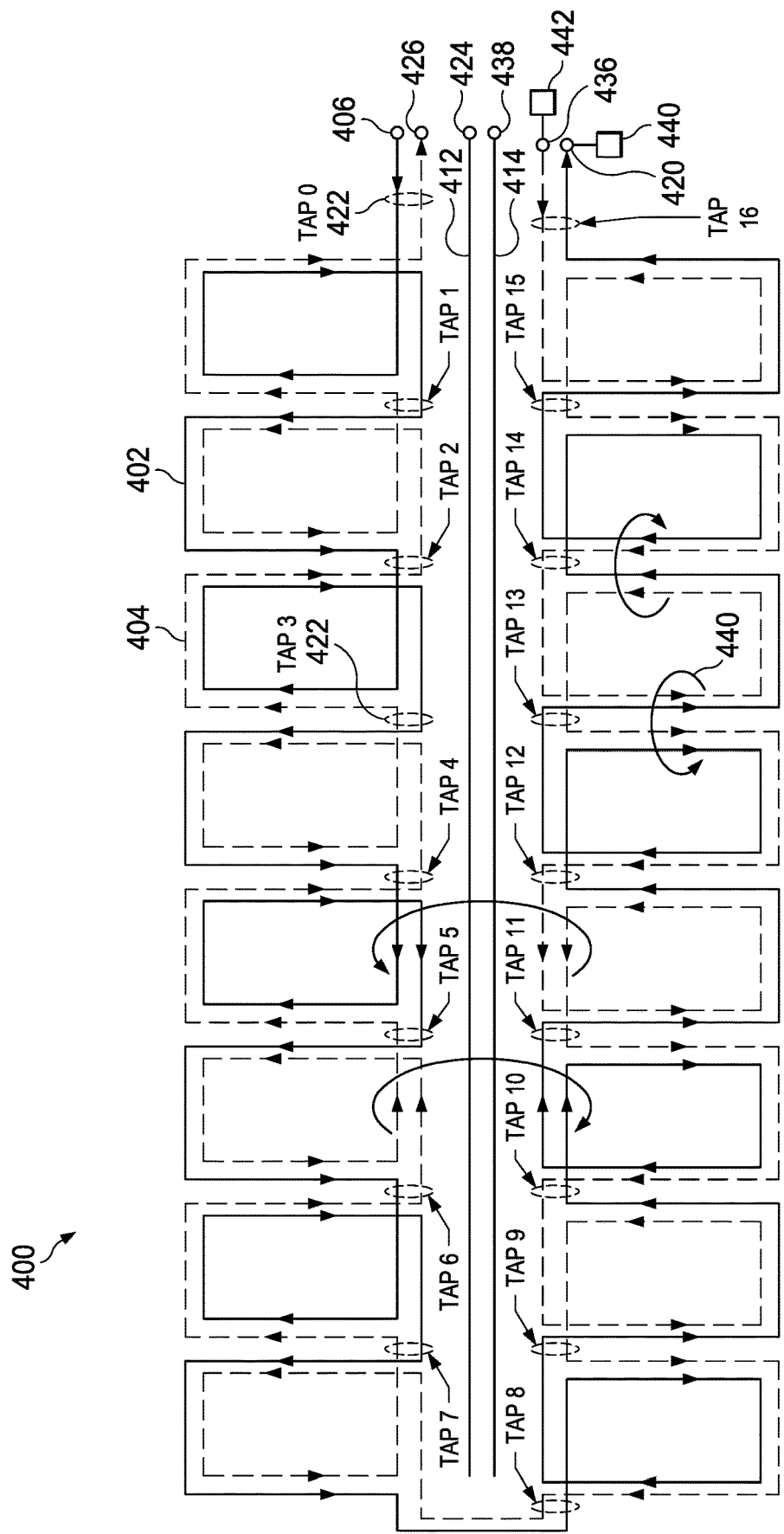
FIG. 4C shows a plan and schematic view of an example of a delay line.

FIG. 4A shows a plan and schematic view 400p of an example of a portion of a delay line 400 as shown in FIG. 4C. The delay line 400 comprises a conductive p line 402 and a conductive n line 404. Starting from a p line input node 406 where a clock (not shown) is inputted onto the p line 402, the p line 402 forms a rectangular loop 408 (coil) which is connected to and proximate to a three-sided rectangular portion 410, so that a side of the three-sided rectangular portion 410 and a side of the rectangular loop 408 are proximate and parallel to each other, as shown in the vertical dimension for the layout of FIG. 4A. The p line 402 crosses itself to close the rectangular loop 408 (without electrically intersecting itself), forming a corner of the rectangular loop 408 which is proximate to the p input node 406 and proximate to the tap lines 412, 414. The p line 402 then progresses away from the p line input node 406, parallel to a p tap line 412 and an n tap line 414 (the tap lines 412, 414 are further described below). The p line 402 then connects to the three-sided rectangular portion 410 that has an open end that faces towards a first side of a p tap line 412 and an n tap line 414. The p line 402 is then connected to sequential repetitions of the rectangular loop 408 and the three-sided rectangular portion 410, so that the rectangular loop 408 and the three-sided rectangular portion 410 alternate to form an upper portion 416 of the p line 402. The p line 402 performs a U-turn at or approximately halfway through its length, so that the rectangular loop 408 then three-sided rectangular portion 410 sequence repeats, but with the open end of the three-sided rectangular portion 410 facing a second side of the p tap line 412 and n tap line 414. The second side of the p tap line 412 and n tap line 414 is opposite the first side. The portion of the p line 402 on the second side of the p tap line 412 and n tap line 414 forms a lower portion 418 of the p line 402. (Accordingly, a major axis of the upper portion 416 of the p line 402 is parallel to a major axis of the lower portion 418 of the p line 402, consistent with the illustration of FIG. 3.) The p line 402 is connected to a termination impedance 440 matching the total impedance of the p line 402 (which terminates the p line 402) at a p line termination node 420. Preferably, the p tap line 412 runs proximate to portions of the upper portion 416 of the p line 402 and portions of the lower portion 418 of the p line 402. This helps reduce the total size of the layout of the delay line 400, and helps reduce the parasitic capacitance contributed by connections between the p line 402 and the p tap line 412 as described with respect to FIG. 6.

Portions of the p tap line 412 and n tap line 414 run proximate to the p line input node 406.

The p tap line 412 and the same-length n tap line 414 run in parallel between the upper portion 416 of the p line 402 and the lower portion 418 of the p line 402 (and also between the upper portion 432 of the n line 404 and the lower portion 434 of the n line 404, as described below with respect to FIGS. 4B and 4C). The p tap line 412 is switchably connectable to the p line 402 and the n tap line 414 is switchably connectable to the n line 404 at multiple evenly-spaced tap locations 422 (as further described with respect to FIGS. 5A through 5D). Accordingly, discrete, selectable locations where the p tap line 412 connects to the p line 402 and locations where the n tap line 414 connects to the n line 404 are proximate to each other. Connections between lines 402, 404 and respective tap lines 412, 414 are direct, selectable conductive path electrical connections, enabling switchable selection from the lines 402, 404 onto the tap lines 412, 414 to output the clock with a respective selected delay. This is akin in certain respects to the connections between the switch 202 and a selected tap location 204 as shown in and described with respect to FIG. 2. Connections between lines 402, 404 and respective tap lines 412, 414 are not shown in FIGS. 4A through 4C to simplify the drawings.

The p tap line 412 is coupled to a p output node 424 which outputs the clock inputted onto the p line 402 with an amount of delay dependent on which tap location 422 is selected (as described with respect to FIG. 3 and further described later).

FIG. 4B shows a plan and schematic view 400n of an example of a portion of a delay line 400 as shown in FIG. 4C. Starting from an n line input node 426 where a clock (not shown) is inputted onto the n line 404, the n line 404 has a three-sided rectangular portion 428 and then a rectangular loop 430 using the same shapes and connections as the p line's 402 three-sided rectangular portion 410 and rectangular loop 408. Starting from the rectangular loop 430, the n line 404 is then coupled to sequential repetitions of the three-sided rectangular portion 428 and then the rectangular loop 430, so that the three-sided rectangular portion 428 and the rectangular loop 430 alternate to form an upper portion 432 of the n line 404. The n line 404 performs a U-turn at or approximately halfway through its length, so that the three-sided rectangular portion 428 then rectangular loop 430 sequence repeats, but with the open end of the three-sided rectangular portion 428 facing the second side of the p tap line 412 and n tap line 414. The portion of the n line 404 on the second side of the p tap line 412 and n tap line 414 forms a lower portion 434 of the n line 404. The n line 404 is coupled to a termination impedance 442 matching the total impedance of the n line 404 (which terminates the n line 404) at an n line termination node 436. The n tap line 414 is coupled to an n output node 438 which outputs the clock inputted onto the n line 404 with an amount of delay dependent on which tap location 422 is selected (as described with respect to FIG. 3). Preferably, the n tap line 414 runs proximate to portions of the upper portion 432 of the n line 404 and portions of the lower portion 434 of the n line 404. This helps reduce the total size of the layout of the delay line 400, and helps reduce the parasitic capacitance contributed by connections between the n line 404 and the n tap lines 414 (via taps 506 and switches 504 as described with respect to FIG. 5).

FIG. 4C shows a plan and schematic view of an example of a delay line 400. As shown in FIG. 4C, the delay line 400 comprises the p line 402 of FIG. 4A and the n line 404 of FIG. 4B interleaved together, whereby a three-sided rectangular portion of one conductivity type is generally positioned around the exterior of the area included by a rectangular loop of the opposite conductivity type. Thus, the p line 402 surround rectangular loops 430 of the n line 404 on three sides (with the open end of p line 402 three-sided rectangular portions 410 facing the p tap line 412 and n tap line 414);

and three-sided rectangular portions 428 of the n line 404 surround rectangular loops 408 of the p line 402 on three sides (with the open end of n line 404 three-sided rectangular portions 428 facing the p tap line 412 and n tap line 414). As a result, the p line 402 and n line 404 are parallel and proximate to each other for a majority of their respective lengths. (The interleaved p line 402 and n line 404 appear similar to a series of side-by-side inductor coils.) Delay line 400 also includes the p tap line 412 and n tap line 414 to which the p line 402 and n line 404 can switchably connect (as described with respect to FIGS. 4A and 4B, and as further described with respect to FIGS. 5A through 5D).

Current on the p line 402 is configured to flow from the p line input node 406 to the p line termination node 420. Current on the n line 404 is configured to flow from the n line termination node 436 to the n line input node 426. (Directions of current flow are further described with respect to FIG. 3.) Accordingly, as shown by the arrows along the p line 402 and n line 404 in FIG. 4C, current flows in the same direction on parallel, proximate portions of the p line 402 and n line 404 for a majority of their respective lengths. Consequently, magnetic fields 440 (B-fields) induced by current flowing through the p line 402 and n line 404 additively reinforce each other. Increased magnetic fields 440 increase the inductance (reactive impedance) of the p line 402 and n line 404, and accordingly increase the delay induced on the clock per unit length of the respective lines 402, 404 through which the clock propagates up to the selected tap location 422.

The serpentine shape and U-turn in the p line 402 and n line 404 also increase the distance traveled by the lines 402, 404 per device area used by the delay line 400. Further, the U-turn enables the total length of the tap lines 412, 414 to be almost halved compared to the tap line length that would be required without the U-turn. This also means that the U-turn enables the total capacitance of the respective tap lines 412, 414 to be approximately halved.

Generally, at a given tap location 422, the distance travelled by a measured signal over the p line 402 or the n line 404, relative to a respective nearest input node 406, 426, will be slightly longer. Preferably, the delay line 400 is designed so that different delay periods resulting from these uneven lengths average out to result in approximately equal delay increments between successive tap locations 422.

Preferably, there is a number M total rectangular loops 408, 428 (rectangular loops 408 plus rectangular loops 430) and M+1 tap locations 422. For a number M+1 tap locations 422, tap locations 422 are preferably numbered from Tap 0, which is located proximate to the input nodes 406, 426, to Tap M, which is located proximate to the termination nodes 420, 436. Numbering of tap locations 422 is sequential along the length of the p line 402 and n line 404. In FIG. 4C, M equals sixteen (16).

Measurements taken at a tap location 422 other than Tap 0 can be compared to measurements taken at Tap 0 to compare a delayed clock output to a clock input. This can be used to determine, for example, the amount of delay introduced by the delay line 400 up to a selected tap location 422, as well as other properties, as shown and/or described with respect to FIGS. 6-13.

The clocks extracted from the p line 402 and the n line 404 at a tap location 422 are preferably referenced against each other, rather than against a ground line. That is, output signals are preferably differential with respect to the p line 402 and the n line 404. The p line 402 and the n line 404 are noise coupled, and accordingly are generally affected by the same noise sources, such as switching noise, noise through the substrate and noise from other circuits. Further, the p line 402 and the n line 404 receive the same effects from PVT variations. By referencing the p line 402 and the n line 404 against each other, noise and effects due to PVT variations (which are applied to both lines) are cancelled out, improving output signal quality.

Figure 5A:
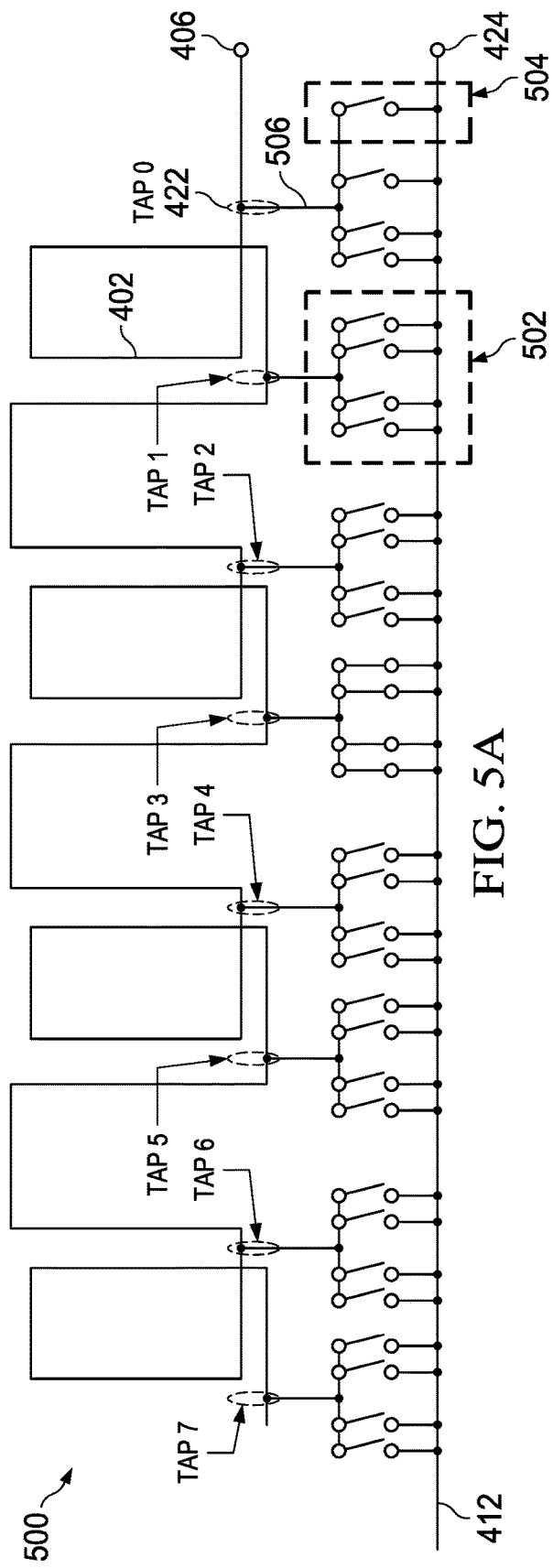
FIG. 5A shows a plan and schematic view of a portion of the circuit shown in FIG. 4A in which multiple groups of switches, connected in parallel to the p line at tap locations, connect the p line to the p tap line.

FIG. 5A shows a plan and schematic view 500 of a portion of the circuit 400p shown in FIG. 4A in which a respective group 502 of switches 504 is connected in parallel between the p line 402 and each respective tap location 422 of the p tap line 412. Further, while FIG. 5A illustrates only the p conductivity type circuit 400p and its respective p tap line 412, also contemplated in an example embodiment is a comparable group of switches connected between the n line 404 and each respective tap location 422 of the n tap line 414, but FIG. 5A eliminates these additional details and thus simplifies FIG. 4A so that the operation of the switches 504 can be clearly shown.

As shown in FIG. 5A, taps 506 (preferably lengths of conductor which are physically short to reduce noise and delay added to the signal) are connected to corresponding tap locations 422 on the signal line 402. Taps 506 are preferably coupled to a corresponding tap line 412 (or 414, for the n type connections not shown) using multiple switches 504. Preferably, each group 502 has a number N switches 504 coupled between a tap 506 and the corresponding tap line 412 (or 414). The tap line 412 (or 414) is coupled to a respective output node 424 (or 438) which thereby receives an output clock signal with a specified delay, that delay corresponding to the specific switch or switches that are closed, as further detailed below. In FIG. 5A, N equals four. In embodiments as shown and/or described with respect to FIGS. 6-13, M (number of tap locations 422 other than an input tap location) equals sixteen, and N (number of switches 504 per group 502 of switches 504) preferably equals sixteen.

Switches 504 enable selectively tapping the delay line 500 to output the clock with a selectively varied delay (as further described below). Switches 504 can be implemented as transmission gates as disclosed in U.S. Pat. No. 7,064,599, which is incorporated herein by reference.

Delay values corresponding to individual tap locations 422 can be interpolated to produce additionally accessible, intermediate delay values by selectively weighting signals extracted from different (preferably adjacent) tap locations 422. Clock delay values are weighted by engaging a selected number of switches 504 corresponding to a tap location 422, and engaging a selected number of switches 504 corresponding to another tap location 422, to thereby couple the different tap locations 422 to the corresponding tap line 412, 414 with selected signal strengths. Switches 504 are preferably configured so that, for tap locations 422 which each are connected to N switches 504, activating a total of N switches 504 (connected to one tap location 422, or connected to and totaled across multiple tap locations 422) will result in an output closely matching the input clock, except with a selected amount of delay corresponding to the selected tap location(s) 422 as weighted by the selected switches 504.

For example, assume M is sixteen and N is sixteen (unlike FIG. 5A, in which case N is four). Also, assume a total of N switches 504 are closed at a time, where the N switches 504 are either attached to a single tap location 422 or to adjacent tap locations 422, and in the latter case such that if X switches 504 are closed in a group 502 of switches 504 connected to one tap location 422, then N−X switches are closed in the group 502 of switches 504 connected to a next adjacent tap location 422. For example, if 10 switches 504 are closed at Tap 2, then 6 (accordingly, N−X=16−10=6) switches 504 are closed at either adjacent Tap 1 or adjacent Tap 3. In such embodiments, there are N switches 504 selectable at each of M+1 tap locations 422 (including Tap 0), so there are a total of (M*N)+1=257 possible combinations of switch 504 selection settings, corresponding to 257 possible delay values. Accordingly, there are 256 settings in which switches 504 connected to a tap location 422 other than Tap 0 are closed; plus one setting in which only switches 504 coupled to Tap 0, corresponding to zero delay, are closed. In this example, assuming linear delay increments (constant step size), if D is a maximum delay, $n_1$ is the number of switches 504 selected for tap $m_1$, and $n_2$ is the number of switches 504 selected for tap $m_2$ ($n_1+n_2=N$), then delay equals:

$$D*\left(\frac{n1}{N}*\frac{m1}{M}+\frac{n2}{N}*\frac{m2}{M}\right)$$

In the delay line as shown in FIG. 5A, the four switches 504 coupled to Tap 3 are closed, connecting Tap 3 to the p tap line 412 and outputting a clock with a delay corresponding to Tap 3.

Figure 5B:
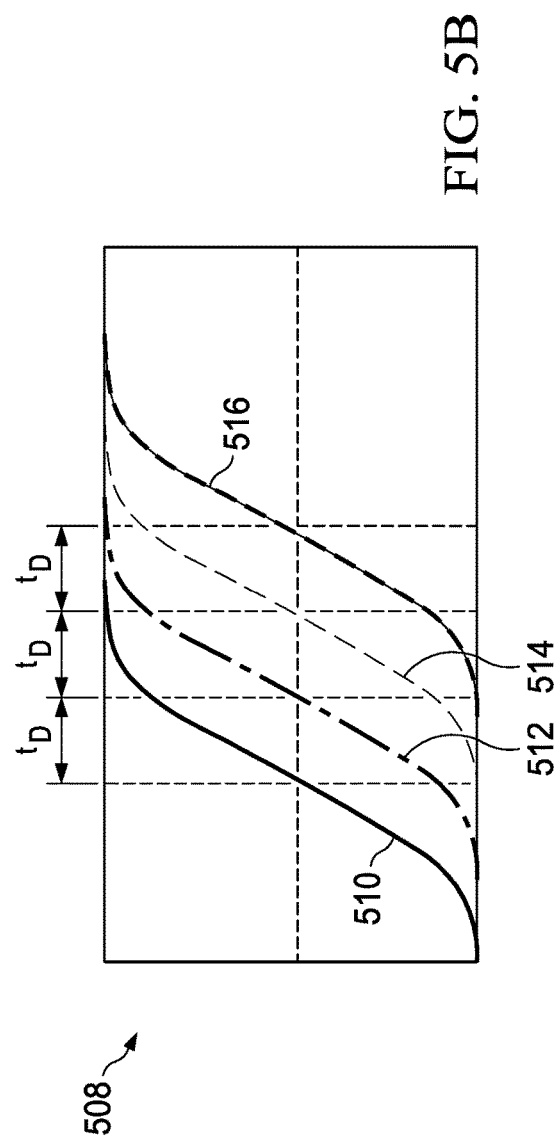
FIG. 5B shows an example of a graph of voltage against time for outputs of the circuit portion (the view) of FIG. 5A.

FIG. 5B shows an example of a graph 508 of voltage against time for outputs of the circuit portion (the view 500) of FIG. 5A. A first curve 510 corresponds to a clock as inputted onto the p line 402 and extracted at Tap 0. A second curve 512 corresponds to an output clock if all four switches 504 of Tap 1 are closed (activated). A third curve 514 corresponds to an output clock if all four switches 504 of Tap 2 are closed. A fourth curve 516 corresponds to an output clock if all four switches 504 of Tap 3 are closed—as they are in FIG. 5A. The time delay added by the p line 402 to a clock travelling between adjacent tap locations 422 is $t_D$. Accordingly, the time delay between each adjacent pair of curves (510, 512, 514, 516) is $t_D$.

FIG. 5C repeats the illustration of FIG. 5A, but with an alternate example of closed switches 504 and for the example where the number of switches 504, N, equals four. Specifically, in FIG. 5C, X=two switches 504 of Tap 2 are selected, and N−X=two switches 504 of adjacent Tap 3 are selected.

FIG. 5D shows an example of a graph 520 of voltage against time for outputs of the circuit portion (the view 518) of FIG. 5C. The graph 520 of FIG. 5D is essentially the same as the graph 508 of FIG. 5B, except that a fifth curve 522 has been added to correspond to the two selected switches 504 of Tap 2 and two selected switches 504 of Tap 3 as shown in the view 518 of FIG. 5C. The fifth curve 522 corresponds to a weighted average between the third curve 514 (corresponding to Tap 2) and the fourth curve 516 (corresponding to Tap 3). The weighting of the average depends on the numbers of selected switches 504 of Tap 2 and Tap 3. Use of switches 504 to weight output clock signals thus enables finer time increments than using a single switch connection per tap location 422.

Figure 6:
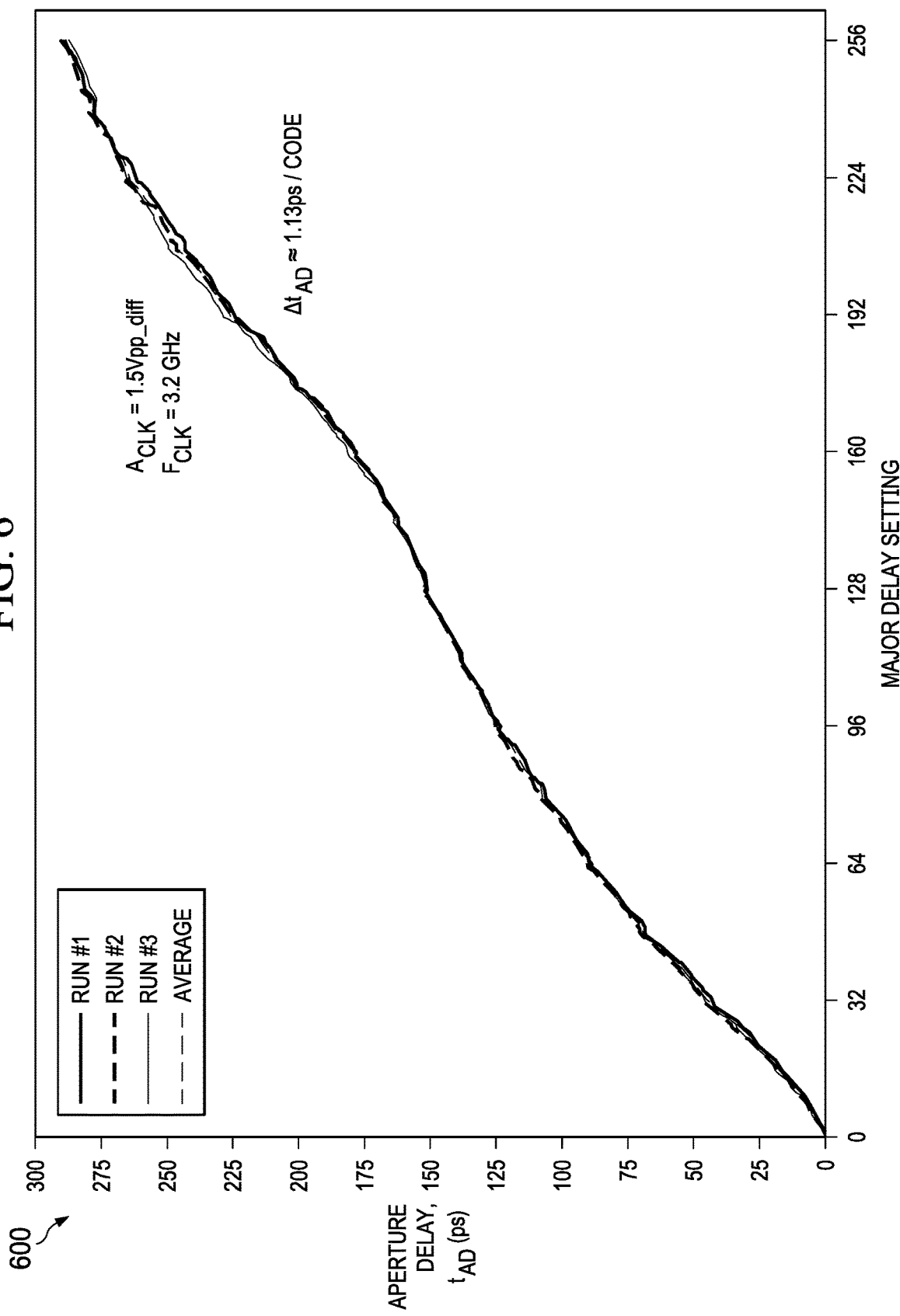
FIG. 6 shows an example of a graph of measured delay against a delay setting corresponding to a selected set of sixteen switches in a delay line as shown in FIG. 4C.

FIG. 6 shows an example of a graph 600 of measured delay against a delay setting corresponding to a selected set of sixteen switches 504 in a delay line 400 as shown in FIG. 4C. If an input signal of an ADC and a sampling clock signal of the ADC are phase locked, a delay applied to the clock signal can be measured and quantified. Vpp-diff is differential peak-to-peak voltage (differential voltage of the signal extracted from the p line 402 with respect to the signal extracted from the n line 404). $F_{CLK}$ is the frequency of the clock signal injected onto the p line 402 and the n line 404 at the respective input nodes 406, 426. $\Delta t_{AD}$ is the average aperture delay step size between adjacent delay settings. (Delay settings are preferably incremented by opening a closed switch 504 at a lowest-number tap location 422 with closed switches 504, and closing a switch 504 at the adjacent higher-number tap location 422). FIG. 6 shows that in some embodiments, an example delay step size is 1.13 picoseconds (x-axis numbering corresponds to switch 504 increments).

Figure 7:
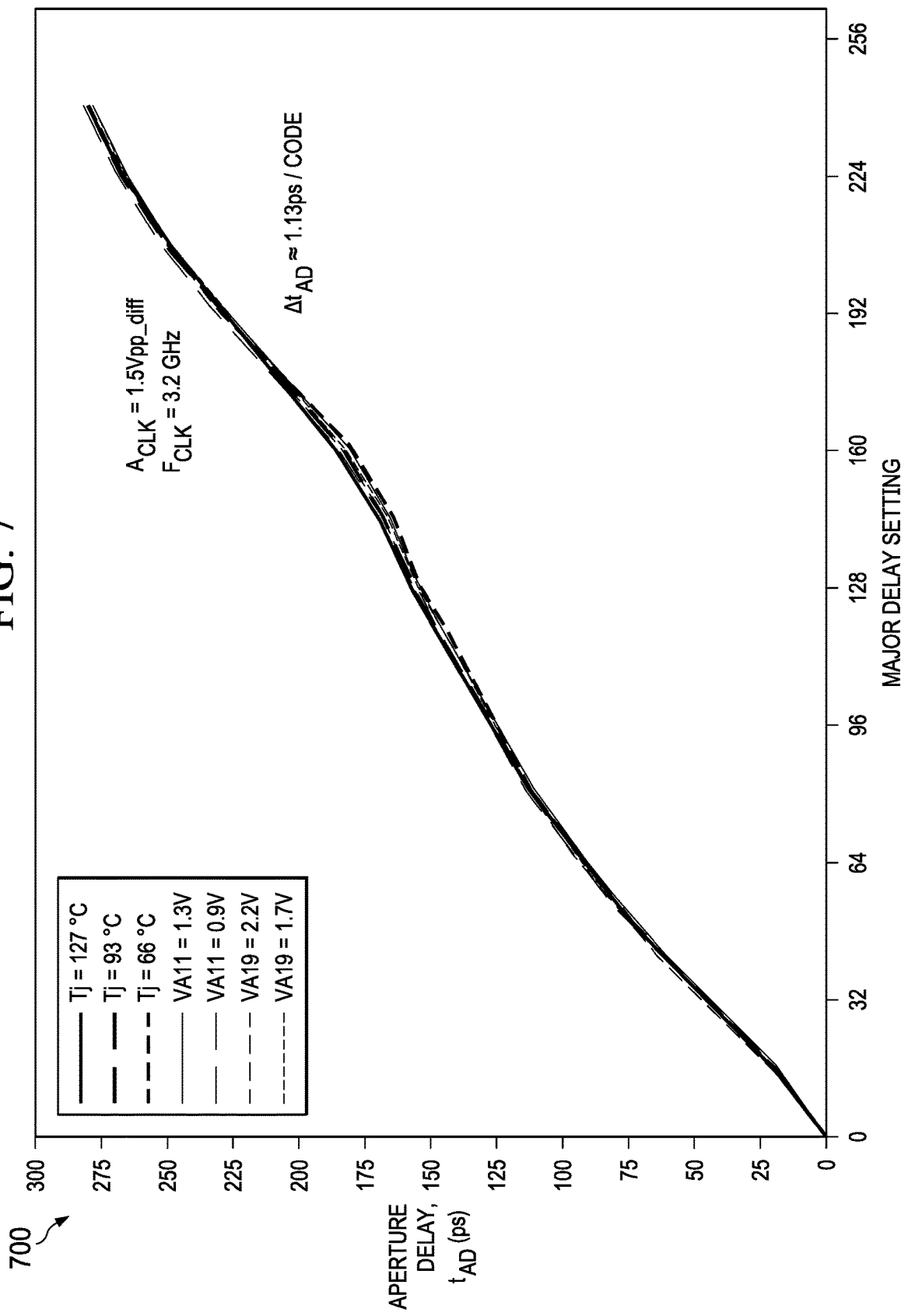
FIG. 7 shows an example of a graph of measured delay against a delay setting corresponding to a selected set of sixteen switches in a delay line as shown in FIG. 4C, for various temperatures and supply voltages.

FIG. 7 shows an example of a graph 700 of measured delay against a delay setting corresponding to a selected set of sixteen switches 504 in a delay line 400 as shown in FIG. 4C, for various temperatures and supply voltages. Variations from PVT invariance in the central range of the curve shown in the graph 700 of FIG. 7 are generally due to non-linear drift of phase locking between a signal source and a clock source. In the example shown in FIG. 7, phase locking drift of instruments is fully corrected at maximum and minimum delay settings, and linearly interpolated in between maximum and minimum delay settings.

Figure 8:
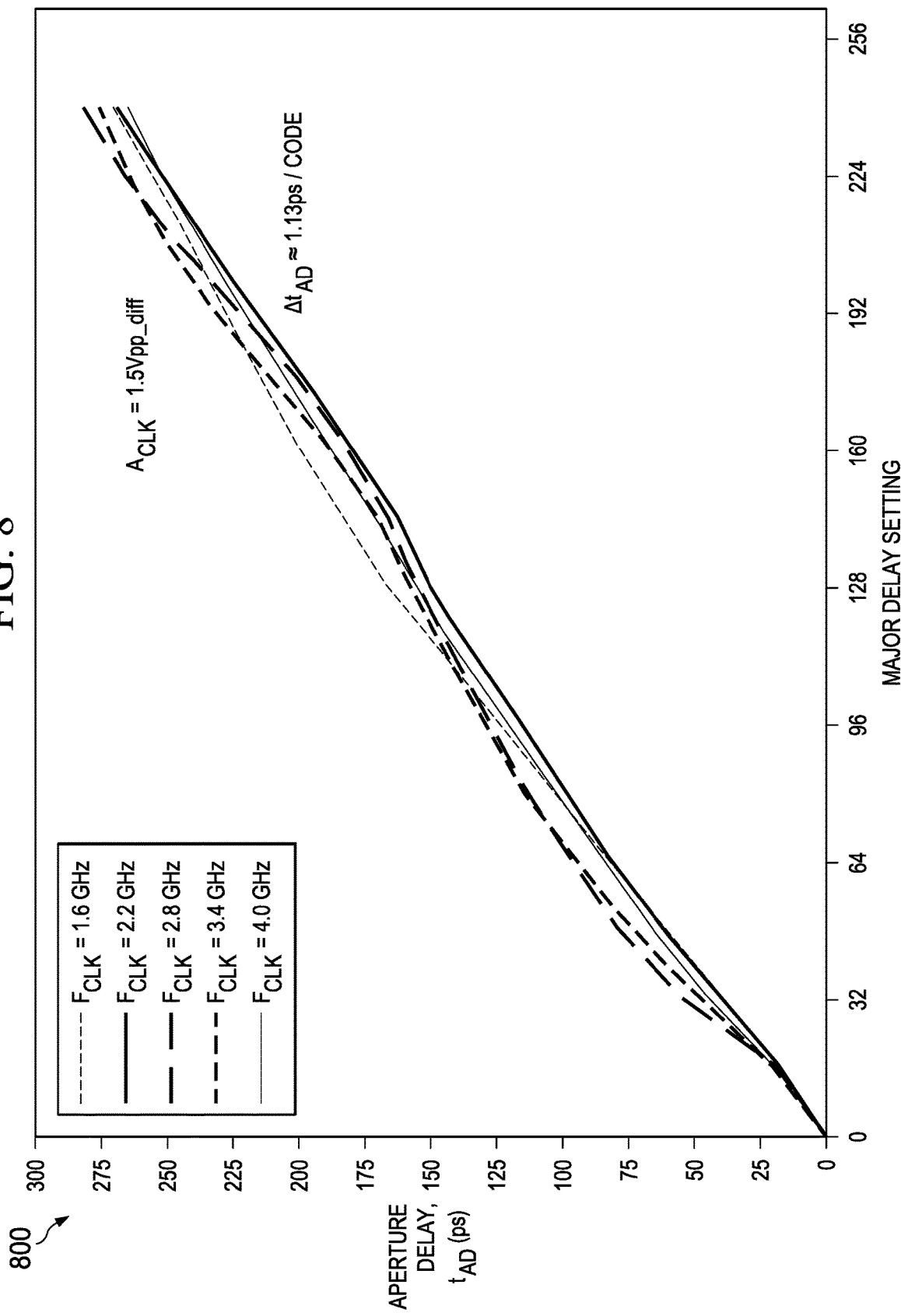
FIG. 8 shows an example of a graph of measured delay against a delay setting corresponding to a selected set of sixteen switches in a delay line as shown in FIG. 4C, for different applied clock frequencies.

FIG. 8 shows an example of a graph 800 of measured delay against a delay setting corresponding to a selected set of sixteen switches 504 in a delay line 400 as shown in FIG. 4C, for different applied clock frequencies. In some embodiments, variations in delay line impedance, and imperfect matching between delay line termination impedance 440, 442 and the delay line 400, result in standing waves on the delay line 400. Accordingly, the relationship between delay of the output clock, and the delay selected by activating corresponding switches 504, varies from linearity. This variation from linearity includes a dependence on clock speed. However, clock speed can generally be precisely controlled.

Figure 9:
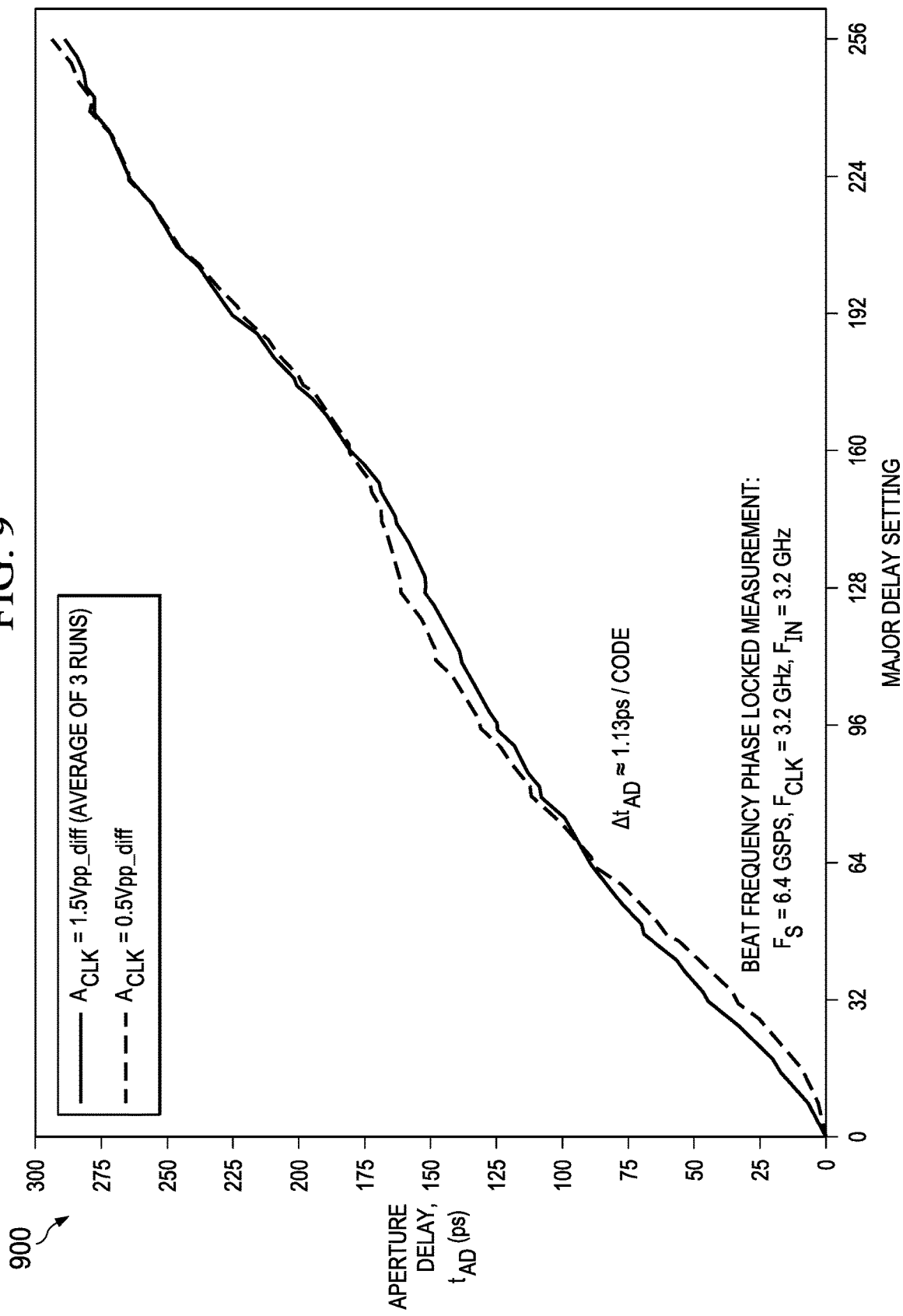
FIG. 9 shows an example of a graph of measured delay against a delay setting corresponding to a selected set of sixteen switches in a delay line as shown in FIG. 4C, for different applied clock amplitudes.

FIG. 9 shows an example of a graph 900 of measured delay against a delay setting corresponding to a selected set of sixteen switches 504 in a delay line 400 as shown in FIG. 4C, for different applied clock amplitudes. (GSPS corresponds to gigasamples per second.)

Figure 10:
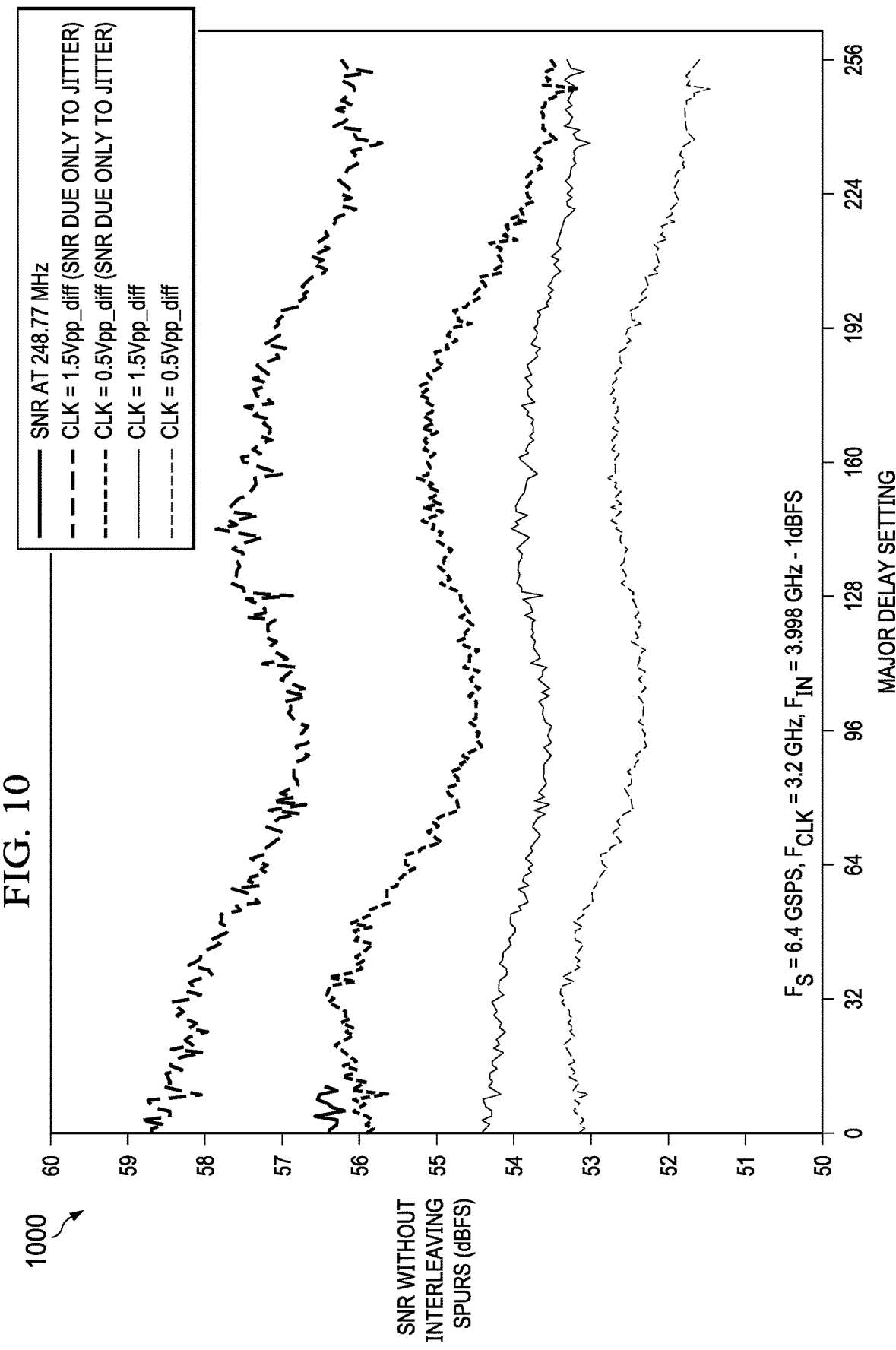
FIG. 10 shows an example of a graph of signal to noise ratio without interleaving spurs, measured in dBFS, against a delay setting corresponding to a selected set of sixteen switches in a delay line as shown in FIG. 4C.

FIG. 10 shows an example of a graph 1000 of signal to noise ratio without interleaving spurs, measured in dBFS, against a delay setting corresponding to a selected set of sixteen switches 504 in a delay line 400 as shown in FIG. 4C. Generally, jitter introduced by delaying a sampling clock corresponds to a degradation in signal-to-noise ratio (SNR), particularly for high analog input frequencies. Accordingly, FIG. 10 shows SNR degradation due to the delay setting. (The unit dBFS corresponds to decibels relative to full scale.)

Figure 11:
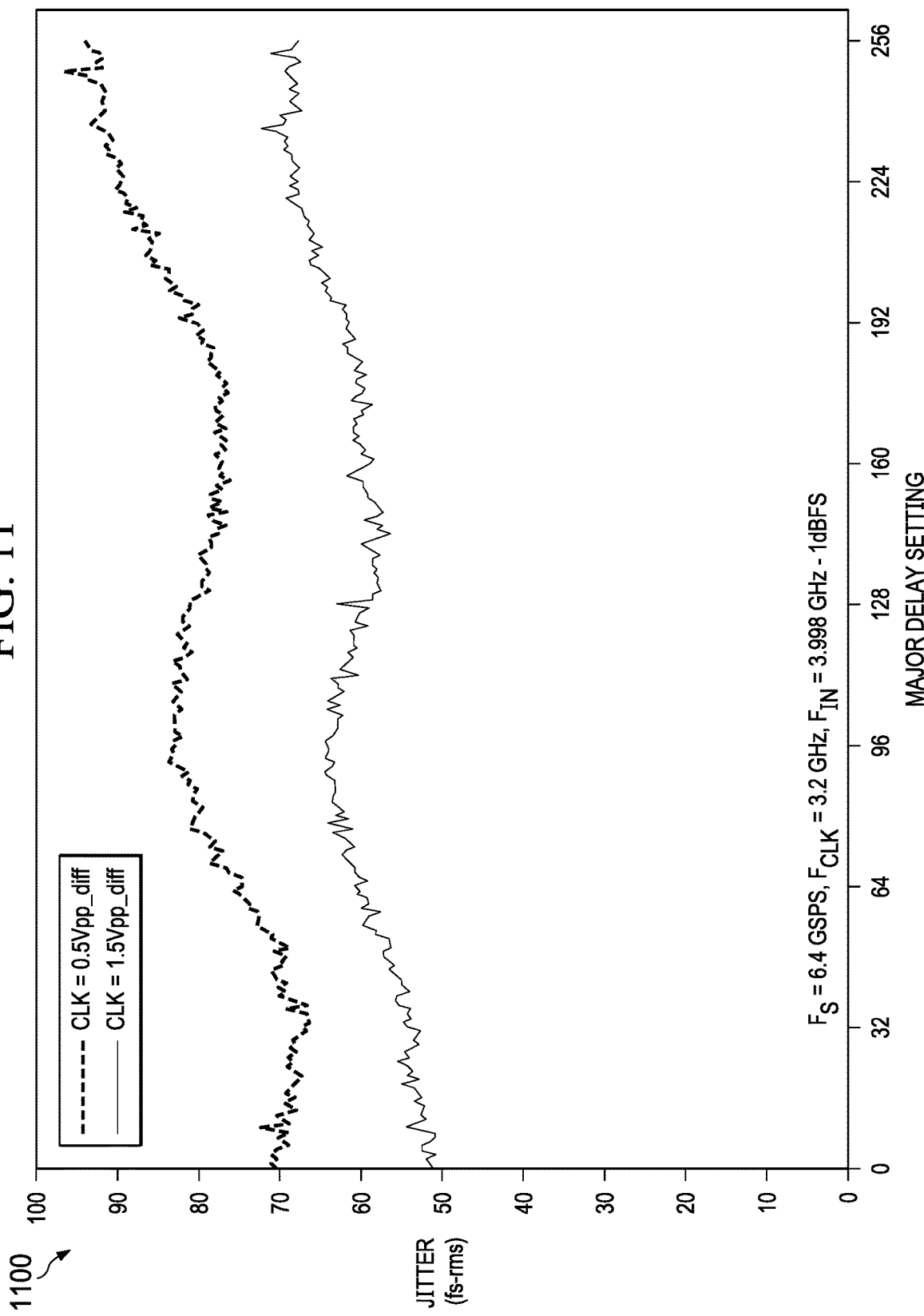
FIG. 11 shows an example of a graph of jitter against a delay setting corresponding to a selected set of sixteen switches in a delay line as shown in FIG. 4C.

FIG. 11 shows an example of a graph 1100 of jitter against a delay setting corresponding to a selected set of sixteen switches 504 in a delay line 400 as shown in FIG. 4C. Generally, the larger the clock amplitude, the smaller the effect of delay settings on jitter. (Jitter is measured in this example in femtoseconds in root-mean-square displacement.)

Figure 12:
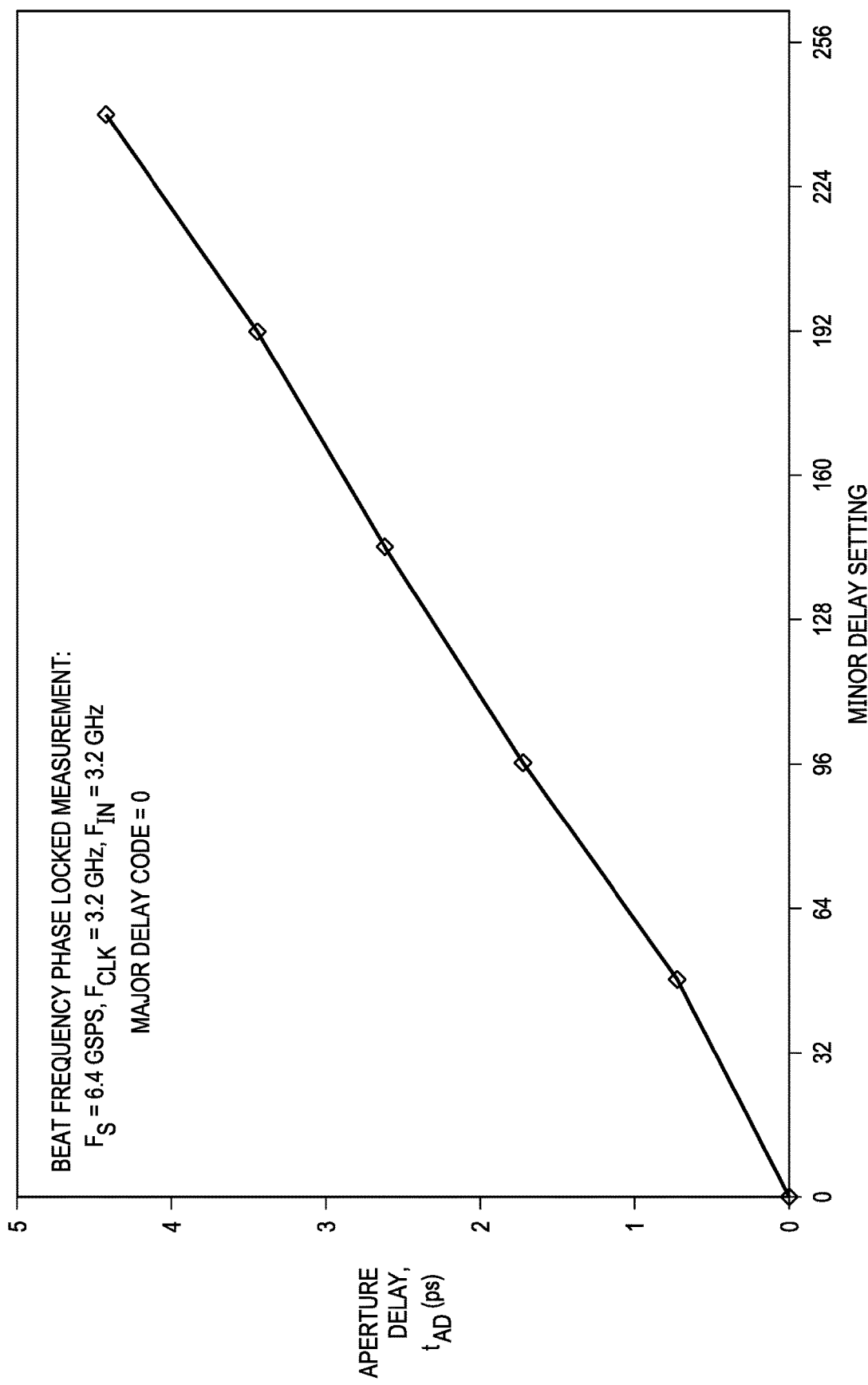
FIG. 12 shows an example of a graph of measured delay against a fine delay setting corresponding to a capacitive delay which can be applied in addition to the coarser delay induced using a delay line as shown in FIG. 4C.

FIG. 12 shows an example of a graph 1200 of measured delay against a fine delay setting corresponding to a capacitive delay which can be applied in addition to the coarser delay induced using a delay line 400 as shown in FIG. 4C. An additional fine delay can be induced by loading the delayed signal (with the delay line) using binary weighted capacitance (not shown). This additional fine delay is proportional to capacitance values, but is not PVT-invariant. However, the capacitive fine delay can provide a delay step size one or more orders of magnitude smaller than the step size corresponding to the switches 504. In FIG. 12, delay induced by fine delay settings is measured where the major delay code is set to zero (accordingly, without additional fine delay, the signal would be extracted at Tap 0, the tap location 422 near the input nodes 406, 426). For example, a step size of 16 femtoseconds can be implemented using binary weighted capacitance (as compared to the example step size of 1.13 picoseconds for a selected set of sixteen switches 504 in a delay line 400 as shown in FIG. 4C, as described above with respect to FIG. 6). Consequently, the proportional variance caused by PVT-related variation in the capacitive delay can be relatively small compared to the delay step sizes corresponding to the tap locations 422 and the switches 504. Use of such fine delay control with a delay line 400 (as shown in FIG. 4C) and switches 504 (as shown in FIG. 5) enables gaps between adjacent switch-selected delay steps to be filled.

Figure 13:
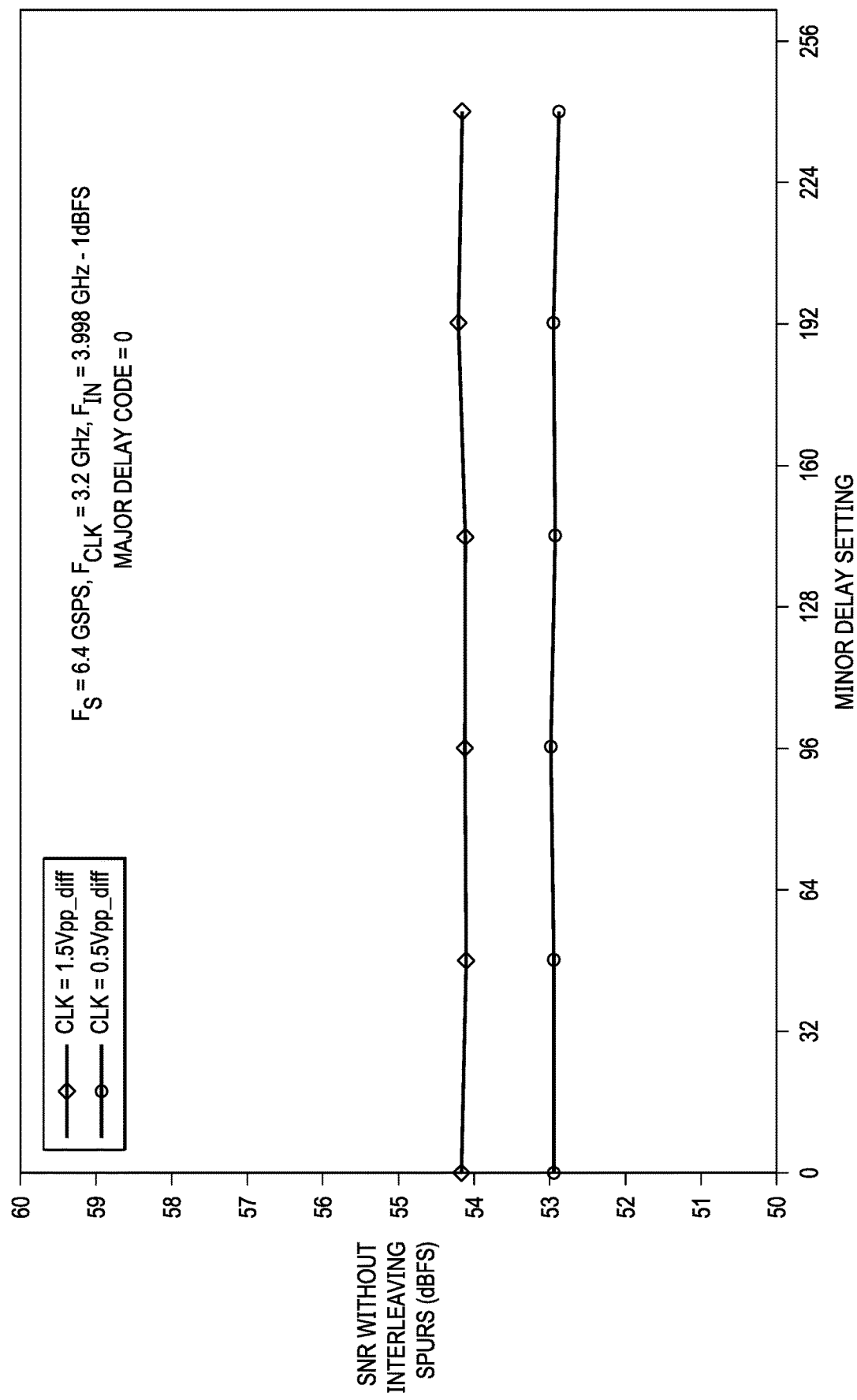
FIG. 13 shows an example of a graph of signal to noise ratio without interleaving spurs, measured in dBFS, against a fine delay setting corresponding to a capacitive delay which can be applied in addition to the coarser delay induced using a delay line as shown in FIG. 4C.

FIG. 13 shows an example of a graph 1300 of signal to noise ratio without interleaving spurs, measured in dBFS, against a fine delay setting corresponding to a capacitive delay which can be applied in addition to the coarser delay induced using a delay line 400 as shown in FIG. 4C. FIG. 13 shows example results corresponding to the major delay code being set to zero (as described with respect to FIG. 12). FIG. 13 delay is implemented using binary weighted capacitance as described with respect to FIG. 12. As shown in FIG. 13, this type of delay has little effect on SNR of the delayed clock signal. Therefore, this type of delay will generally have little effect on jitter.

The disclosed innovations, in various embodiments, provide one or more of at least the following advantages. However, not all of these advantages result from every one of the innovations disclosed, and this list of advantages does not limit the various claimed inventions.

Enables fine control over selected signal delay;
Enables low-power, low-noise, low-jitter signal delay;
Provides a PVT-invariant signal delay;
Delay elements efficiently use device area; and
Uses low-cost delay elements.

Methods, systems and devices are disclosed for delaying a clock or other signal by a selectable period using a device area-efficient PVT-invariant delay line. This is preferably done using a delay line with passive delay elements including two metal lines, individual lines including alternating coupled three-sided rectangles and rectangular loops, three-sided rectangles of one line proximate and parallel to, and surrounding, the rectangular loops of the other line on three sides; the open end of the three-sided rectangles faces tap lines used to connect to evenly-spaced tap locations on the lines. The metal lines run on one side of the tap lines, and then U-turn to run on the other side of the tap lines. One line conducts current from its input to its terminating impedance, while the other line conducts current from its separate terminating impedance to its separate input. However, because of their serpentine shape and interleaved placement, the lines conduct current in a predominantly parallel direction for the majority of their respective lengths. This means that the magnetic fields of the n line and p line are oriented in the same direction and reinforce each other, increasing delay per distance traveled on the delay line. The n line and p line are also referenced to each other, rather than a ground, so that noise and PVT effects (common mode noise) largely cancel out. In signals with equal amplitude and the same phase noise on a differential pair, phase noise cancels out or becomes common mode noise. PVT effects cancel out because the delay is implemented using metal lines and the propagation delay generally depends only on the distance the signal travels and on the dielectric constant of the medium (the latter generally being well-controlled). Accordingly, the delay line is PVT-invariant. The lines have multiple tap locations, individual tap locations for one line proximate to corresponding tap locations for the other line. At tap locations, the signal carried by the lines can be coupled to an output, which enables selecting a delay amount. Multiple parallel switches per tap location enable outputting a delay amount weighted between delay amounts corresponding to different tap locations, thereby enabling fine control over selected delay.

Modifications and Variations

Modifications are possible in the described embodiments, and other embodiments are possible, within the scope of the claims.

In some embodiments as shown in FIG. 4C, each tap being coupled to sixteen switches and switch selection (and activation) being restricted to adjacent taps, each additional switch closed on a higher-numbered tap (corresponding to one less switch closed on a lower-numbered tap) corresponds to an additional 1 ps (picosecond) delay.

In some embodiments using switches connected between delay lines and corresponding tap lines to achieve a finer delay step size than achieved by the tap positions, cascaded stages of the switches can be used to achieve an even finer delay step size.

In some embodiments, a signal other than a clock is input into the delay line.

In some embodiments, a number of rectangular loops other than sixteen is used. In some embodiments, a number of taps other than seventeen is used. In some embodiments, the number of taps does not equal the number of rectangular loops plus one. In some embodiments, a number of switches different from the number of taps is used.

In some embodiments, non-adjacent tap locations are used for delay value interpolation.

In some embodiments, an RLC (resistance-inductance-capacitance) interconnect is used as a delay line, using the inductance to achieve desired delay.

In some embodiments, a single ended metal line can be used as a delay line to delay the signal.

In some embodiments, there is no U-turn. In some embodiments, there are multiple bends (changes in direction; for example, U-turns) in the delay line.

In some embodiments, the "rectangular loops" vary from the rectangular, such as with curvature at corners or on sides distant from (facing away from) tap lines.

What is claimed is:

1. An electronic circuit for delaying a signal, comprising:
a delay line with multiple tap locations, the delay line configured to receive the signal at an input node;
a tap line proximate to the delay line and coupled to an output node; and
multiple groups of one or more switches, switches in respective ones of the groups of switches severally coupled between ones of the tap locations corresponding to the respective group of switches, and the tap line;
the switches being configured so that when the signal is propagated through the delay line: a first number of first ones of the switches corresponding to a selected tap location are closed, a second number of second ones of the switches corresponding to an adjacent tap location to the selected tap location are closed, and the signal is transmitted with a delay through the closed switches, to the tap line, to the output node;
the switches being configured so that the delay includes a weighted average of a first delay corresponding to the selected tap location and a second delay corresponding to the adjacent tap location, a weighting of the weighted average at least partially dependent on the first number and the second number;

wherein when ones of the switches are closed, the first number of switches can equal zero or the second number of switches can equal zero, but not both simultaneously.

2. An electronic circuit for delaying a signal, comprising:

a delay line with multiple tap locations, the delay line configured to receive the signal at an input node;

a tap line proximate to the delay line and coupled to an output node; and multiple groups of one or more switches, switches in respective ones of the groups of switches severally coupled between ones of the tap locations corresponding to the respective group of switches, and the tap line;

the switches being configured so that when the signal is propagated through the delay line: a first number of first ones of the switches corresponding to a selected tap location are closed, a second number of second ones of the switches corresponding to an adjacent tap location to the selected tap location are closed, and the signal is transmitted with a delay through the closed switches, to the tap line, to the output node;

the switches being configured so that the delay includes a weighted average of a first delay corresponding to the selected tap location and a second delay corresponding to the adjacent tap location, a weighting of the weighted average at least partially dependent on the first number and the second number;

wherein there are M+1 tap locations (taps), and tap locations are serially numbered along the length of the delay line beginning at a tap location which is closest to the input node and which is numbered tap zero (tap 0);

wherein the selected tap location is numbered tap m1 and the adjacent tap location is numbered tap m2;

wherein there are N switches in each of the groups of switches, the first number is n1 and the second number is n2; and wherein the delay per unit distance of the delay line is constant, D is the delay induced on the signal between tap 0 and tap M, and the weighted average is:

$$D * \left( \frac{n1}{N} * \frac{m1}{M} + \frac{n2}{N} * \frac{m2}{M} \right).$$

3. An electronic circuit for delaying a signal, comprising:

a delay line with multiple tap locations, the delay line configured to receive the signal at an input node;

a tap line proximate to the delay line and coupled to an output node; and multiple groups of one or more switches, switches in respective ones of the groups of switches severally coupled between ones of the tap locations corresponding to the respective group of switches, and the tap line;

the switches being configured so that when the signal is propagated through the delay line: a first number of first ones of the switches corresponding to a selected tap location are closed, a second number of second ones of the switches corresponding to an adjacent tap location to the selected tap location are closed, and the signal is transmitted with a delay through the closed switches, to the tap line, to the output node;

the switches being configured so that the delay includes a weighted average of a first delay corresponding to the selected tap location and a second delay corresponding to the adjacent tap location, a weighting of the weighted average at least partially dependent on the first number and the second number;

wherein the delay line includes an n line and a p line, the n line configured to carry a signal in a first direction, the p line configured to carry the signal in a second direction opposite the first direction, a majority of the n line proximate to a majority of the p line;

wherein the tap line includes:
 a first tap line proximate to portions of the n line and configured to couple the n line to an output node at selected ones of the tap locations on the n line; and
 a second tap line proximate to the first tap line, proximate to portions of the p line, and configured to couple the p line to an output node at selected ones of the tap locations on the p line; and wherein individual tap locations include a coupling between the first tap line and the n line, and a coupling between the second tap line and the p line, and individual tap locations are located so that tap location couplings on the n line are proximate to corresponding tap location couplings on the p line.

4. The electronic circuit of claim 3, wherein the n line includes multiple n line rectangular loops which do not electrically self-intersect and multiple n line three sided rectangular portions, the p line including multiple p line rectangular loops which do not electrically self-intersect and multiple p line three sided rectangular portions, the n line three sided rectangular portions located to surround the p line rectangular loops on three sides, the p line three sided rectangular portions located to surround the n line rectangular loops on three sides; and wherein the n line rectangular loops are arranged side-by-side with the p line rectangular loops, so that along a main axis of placement of the n line rectangular loops and the p line rectangular loops, the n line rectangular loops alternate with the p line rectangular loops, and so that a majority of portions of the n line and the p line which are proximate to each other are configured to carry the signal in parallel to and in a same direction as each other.

5. The electronic circuit of claim 3, wherein the n line includes multiple n line rectangular loops which do not electrically self-intersect and the p line including multiple p line rectangular loops which do not electrically self-intersect, the n line rectangular loops and the p line rectangular loops being arranged so individual ones of the n line rectangular loops are adjacent to one or more respective ones of the p line rectangular loops, and so a main axis of placement of adjacent ones of the rectangular loops is linear.

6. An electronic circuit for delaying a signal, comprising:

a conductive p tap line coupled to a p line output node;

a conductive n tap line coupled to an n line output node, the p tap line proximate to the n tap line;

a conductive p line, the p line including multiple p line blocks, individual p line blocks comprising a three-sided rectangular portion coupled to a rectangular loop so that an open end of the three-sided rectangular portion faces the p tap line and the n tap line, a first portion of the p line being on a first side of the p tap line and a first side of the n tap line, a second portion of the p line being on a second side of the p tap line and a second side of the n tap line, the second side of the p tap line and the second side of the n tap line being opposite the first side of the p tap line and the first side of the n tap line, the first and second portions of the p line being coupled to each other, the p line configured to receive the signal at a p line input node, the p line coupled to a termination impedance at a p line termination node, the p line configured to conduct current from the p line input node to the p line termination node;

a conductive n line, the n line including multiple n line blocks, individual n line blocks comprising a three-sided rectangular portion coupled to a rectangular loop so that an open end of the three-sided rectangular portion faces the p tap line and the n tap line, a first portion of the n line being on the first side of the p tap line and the first side of the n tap line, a second portion of the n line being on the second side of the p tap line and the second side of the n tap line, the first and second portions of the n line being coupled to each other, the n line configured to receive the signal at an n line input node, the n line coupled to a termination impedance at an n line termination node, the n line configured to conduct current from the n line termination node to the n line input node;

multiple tap locations, each tap location in the multiple locations comprising a location on the p line at which the p line is coupled to the p tap line via a switch, and a location on the n line at which the n line is coupled to the n tap line via a switch, the location on the p line proximate to the location on the n line; and in which individual p line three-sided rectangular portions are proximate to, parallel to, and surround respective individual n line rectangular loops on three sides, and individual n line three-sided rectangular portions are proximate to, parallel to, and surround respective individual p line rectangular loops on three sides.

7. The electronic circuit of claim 6, wherein a majority of the p line is proximate and parallel to a majority of the n line.

8. The electronic circuit of claim 6, wherein the p line and the n line are configured to carry current in the same direction with the same orientation for a majority of their respective lengths.

9. The electronic circuit of claim 8, wherein the p line input node is proximate to the n line input node, and the p line termination node is proximate to the n line termination node.

10. The electronic circuit of claim 6, wherein a main axis of the first portions of the p line and the n line are parallel to the p tap line and the n tap line, and a main axis of the second portions of the p line and the n line are parallel to the p tap line and the n tap line.

11. The electronic circuit of claim 6, wherein a main axis of the first portion of the p line is proximate and parallel to a main axis of the first portion of the n line, and a main axis of the second portion of the p line is proximate and parallel to a main axis of the second portion of the n line.

12. The electronic circuit of claim 6, wherein a delay output node is configured to receive a differential signal between a signal carried by the p tap line and a signal carried by the n tap line.

13. A method of delaying an electronic signal, the method comprising:
   a) inputting the signal to a delay line with multiple tap locations;
   b) closing a first number of switches of a first group of multiple switches which are severally coupled between a first one of the tap locations and a tap line which is proximate to the delay line and coupled to an output node, the first tap location corresponding to a first delay;
   c) closing a second number of switches of a second group of multiple switches which are severally coupled between a second one of the tap locations and the tap line, the second tap location corresponding to a second delay; and
   d) outputting the signal to the output node with a selected delay, the switches configured so that the selected delay is a weighted average of the first delay and the second delay, the weighted average at least partially dependent on the first specified number and the second specified number;
   in which there are M+1 tap locations, and taps are serially numbered along the length of the delay line beginning at the input node, the input node being numbered tap zero (tap 0); the selected tap location is numbered tap m1 and the adjacent tap location is numbered tap m2; there are N switches in each of the groups of switches; a number of the closed first switches is n1 and a number of the closed second switches is n2; the delay per unit distance of the delay line is constant, and D is the delay induced on the signal between tap 0 and tap M; and the weighted average is:

$$D * \left( \frac{n1}{N} * \frac{m1}{M} + \frac{n2}{N} * \frac{m2}{M} \right).$$

14. A method of delaying an electronic signal, the method comprising:
   a) inputting the signal to a delay line with multiple tap locations;
   b) closing a first number of switches of a first group of multiple switches which are severally coupled between a first one of the tap locations and a tap line which is proximate to the delay line and coupled to an output node, the first tap location corresponding to a first delay;
   c) closing a second number of switches of a second group of multiple switches which are severally coupled between a second one of the tap locations and the tap line, the second tap location corresponding to a second delay; and
   d) outputting the signal to the output node with a selected delay, the switches configured so that the selected delay is a weighted average of the first delay and the second delay, the weighted average at least partially dependent on the first specified number and the second specified number;
   in which the step a) comprises inputting the signal to a p line and an n line, the p line carrying current from a p line input receiving the signal to a p line termination impedance, and the n line carrying current from an n line termination impedance to an n line input, a majority of the n line proximate to a majority of the p line; the step b) comprises coupling the p line to a p tap line; the step c) comprises coupling the n line to an n tap line; and further comprising, between the steps c) and d):
   e) differentially referencing the p tap line to the n tap line to produce a differential signal, the step d) comprising outputting the differential signal.

15. The method of claim 14, in which the differential signal is invariant with respect to changes in process, temperature and voltage.

16. The method of claim 14, in which over a majority of the lengths of the p line and the n line, a magnetic field induced by the p line reinforces a magnetic field induced by the n line.

* * * * *